(12) United States Patent
Lin et al.

(10) Patent No.: US 8,837,132 B2
(45) Date of Patent: Sep. 16, 2014

(54) POSITIONING RACK MODULE AND AN ELECTRONIC DEVICE ASSEMBLY INCORPORATING THE SAME

(75) Inventors: Te-An Lin, New Taipei (TW); Chih-Hsiung Chen, New Taipei (TW)

(73) Assignee: Aopen Inc., New Taipei (TW)

( * ) Notice: Subject to any disclaimer, the term of this patent is extended or adjusted under 35 U.S.C. 154(b) by 706 days.

(21) Appl. No.: 13/078,738

(22) Filed: Apr. 1, 2011

(65) Prior Publication Data
US 2011/0292581 A1 Dec. 1, 2011

(30) Foreign Application Priority Data
May 31, 2010 (TW) ............................. 099210276 U

(51) Int. Cl.
*H05K 7/00* (2006.01)
*H05K 5/02* (2006.01)
*F16M 13/02* (2006.01)
*F16M 13/00* (2006.01)
*G06F 1/16* (2006.01)

(52) U.S. Cl.
CPC ...... *H05K 5/0204* (2013.01); *G06F 2200/1631* (2013.01); *F16M 13/02* (2013.01); *F16M 13/00* (2013.01); *G06F 1/1607* (2013.01); *G06F 1/16* (2013.01)
USPC ............ 361/679.21; 361/679.01; 361/679.02; 361/679.22; 361/679.27; 361/679.58

(58) Field of Classification Search
USPC .............. 361/679.01, 679.02, 679.2, 679.21, 361/679.22, 679.27, 679.58, 679.33, 679.4, 361/679.41, 679.44; 211/22, 32, 33, 35, 63; 248/231.9, 221.12, 339, 222.13, 248/292.14, 298.1, 122.1, 201, 205.1, 560
See application file for complete search history.

(56) References Cited

U.S. PATENT DOCUMENTS 7,580,254 B2 * 8/2009 Anderson ................ 361/679.41
2010/0271764 A1 * 10/2010 Gardes ..................... 361/679.01

* cited by examiner

*Primary Examiner* — Robert J Hoffberg
*Assistant Examiner* — Hung Dang
(74) *Attorney, Agent, or Firm* — Banner & Witcoff, Ltd.

(57) ABSTRACT

A positioning rack module for supporting a computer at a backside of a display device includes a movable frame. The movable frame includes a movable frame body to be disposed at the backside of the display device, and a first receiving portion formed in the movable frame body for receiving the computer. The movable frame body is operable to move relative to the display device between a hidden position and an exposed position. The movable frame body is hidden behind the backside of the display device when disposed at the hidden position. The movable frame body extends beyond a lateral side of the display device when disposed at the exposed position.

20 Claims, 8 Drawing Sheets

POSITIONING RACK MODULE AND AN ELECTRONIC DEVICE ASSEMBLY INCORPORATING THE SAME

CROSS-REFERENCE TO RELATED APPLICATION

This application claims priority of Taiwanese Application No. 099210276, filed on May 31, 2010.

BACKGROUND OF THE INVENTION

1. Field of the Invention

The invention relates to a positioning rack module and an electronic device assembly, more particularly to a positioning rack module for supporting a computer at a backside of a display device and to an electronic device assembly including a display device and the positioning rack module.

2. Description of the Related Art

Currently, a flat panel monitor is generally constituted by a wall-mounted display device that is equipped with a host computer (e.g., a barebone) for hanging on the wall. For aesthetic reasons, the computer is normally mounted at the backside of the display device such that when the display device is hung, the computer is disposed between the backside of the display device and the wall. However, the problem with this kind of arrangement is that since the space between the display device and the wall is too narrow for performing maintenance on the computer, the display device has to be removed from the wall in order to remove the computer for maintenance or replacement, which is quite inconvenient.

SUMMARY OF THE INVENTION

Therefore, the object of the present invention is to provide a positioning rack module for supporting a computer at a backside of a display device and for facilitating convenient removal of the computer.

According to one aspect of the present invention, there is provided a positioning rack module for supporting a computer at a backside of a display device. The positioning rack module includes a movable frame. The movable frame includes a movable frame body to be disposed at the backside of the display device, and a first receiving portion formed in the movable frame body for receiving the computer. The movable frame body is operable to move relative to the display device between a hidden position and an exposed position. The movable frame body is hidden behind the backside of the display device when disposed at the hidden position. The movable frame body extends beyond a lateral side of the display device when disposed at the exposed position.

With the provision of the movable frame body, the computer may be quickly and conveniently removed and installed when the display device is mounted to a wall. Such kind of operations is no longer restricted by the narrow space between the backside of the display device and the wall.

Additionally, the positioning rack module further includes a fixing frame to be mounted between the backside of the display device and a wall mounting rack, which is for mounting the display device to the wall. The fixing frame is coupled to the movable frame body so as to dispose the movable frame body at the backside of the display device.

The fixing frame not only serves to dispose the movable frame body at the backside of the display device, but also protects the computer received in the movable frame body and helps maintain an overall appearance of the positioning rack module.

Furthermore, the movable frame further includes a second receiving portion and a cable-organizing portion formed in the movable frame body and disposed below the first receiving portion. The second receiving portion is configured for receiving an electric component (e.g., a transformer) coupled electrically to the computer. The cable-organizing portion is configured for receiving a cable coupled electrically to the computer.

With the provision of the second receiving portion and the cable-organizing portion, not only is possible to store the electric component and the cable along with the computer in the movable frame, but the cable can also be organized neatly therein to thereby maintain a tidy overall appearance.

Preferably, the fixing frame includes first and second frame bodies. The second frame body includes a front plate, a rear plate and a side plate that cooperate to define an inner space. The first frame body is mounted to the side plate of the second frame body. The movable frame body is coupled pivotally to and is disposed between the front and rear plates.

Moreover, the movable frame body includes a base plate, first and second side plates extending forwardly, vertically and respectively from opposite side edges of the base plate, and a first stop plate extending transversely and forwardly from the base plate . The first receiving portion is defined cooperatively by the first stop plate and portions of the base plate and the first and second side plates that are disposed above the first stop plate.

The second frame body further includes a first extension plate extending from a bottom edge of one of the front and rear plates toward the other one of the front and rear plates. The movable frame body further includes a second extension plate extending forwardly from a bottom part of the base plate. The first and second extension plates are spaced apart from each other in the vertical direction when the movable frame body is disposed at the hidden position so as to permit extension of a cable connected to the computer therebetween. As such, the first and second extension plates also facilitate cable organization.

Further, the movable frame body is coupled pivotally to the second frame body, is disposed in the inner space when at the hidden position, and is moved out of the inner space when at the exposed position. The front and rear plates of the second frame body cooperate to define an opening side therebetween at a location opposite to the side plate to permit movement of the movable frame body into and out of the inner space.

Each of the front and rear plates of the second frame body is formed at the bottom edge with a first pivot hole adjacent to the opening side. The movable frame body further includes two protruding plates that extend toward each other respectively from bottom edges of the first and second side plates. The movable frame body has four second pivot holes, respectively formed in the two protruding plates and in two corners at the bottom edge of the base plate. The second pivot hole in each of the two protruding plates is aligned with the second pivot hole formed in a corresponding one of the corners. The fixing frame further includes an axle that extends through the first pivot holes and a selected aligned pair of the second pivot holes so as to couple pivotally the movable frame body to the second frame body.

With the provision of the first pivot holes and the second pivot holes, mounting of the movable frame has better maneuverability and is not restricted to a single side of the display device.

Optionally, the movable frame further includes a lock member disposed on a selected one of the first and second side plates. Each of the front and rear plates of the second frame body is formed with an engaging hole at the opening side. The lock member has a latch that is operable to engage the engaging hole in a corresponding one of the front and rear plates.

Through the provision of the lock member, the computer supported by the positioning rack module can be secured, and it can also be ensured that the movable frame is not easily moved from the hidden position to the exposed position.

Another object of the present invention is to provide an electronic device assembly that incorporates the positioning rack module described above. The electronic device includes a display device having a backside, and the abovementioned positioning rack module for supporting a computer at the backside of the display device.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
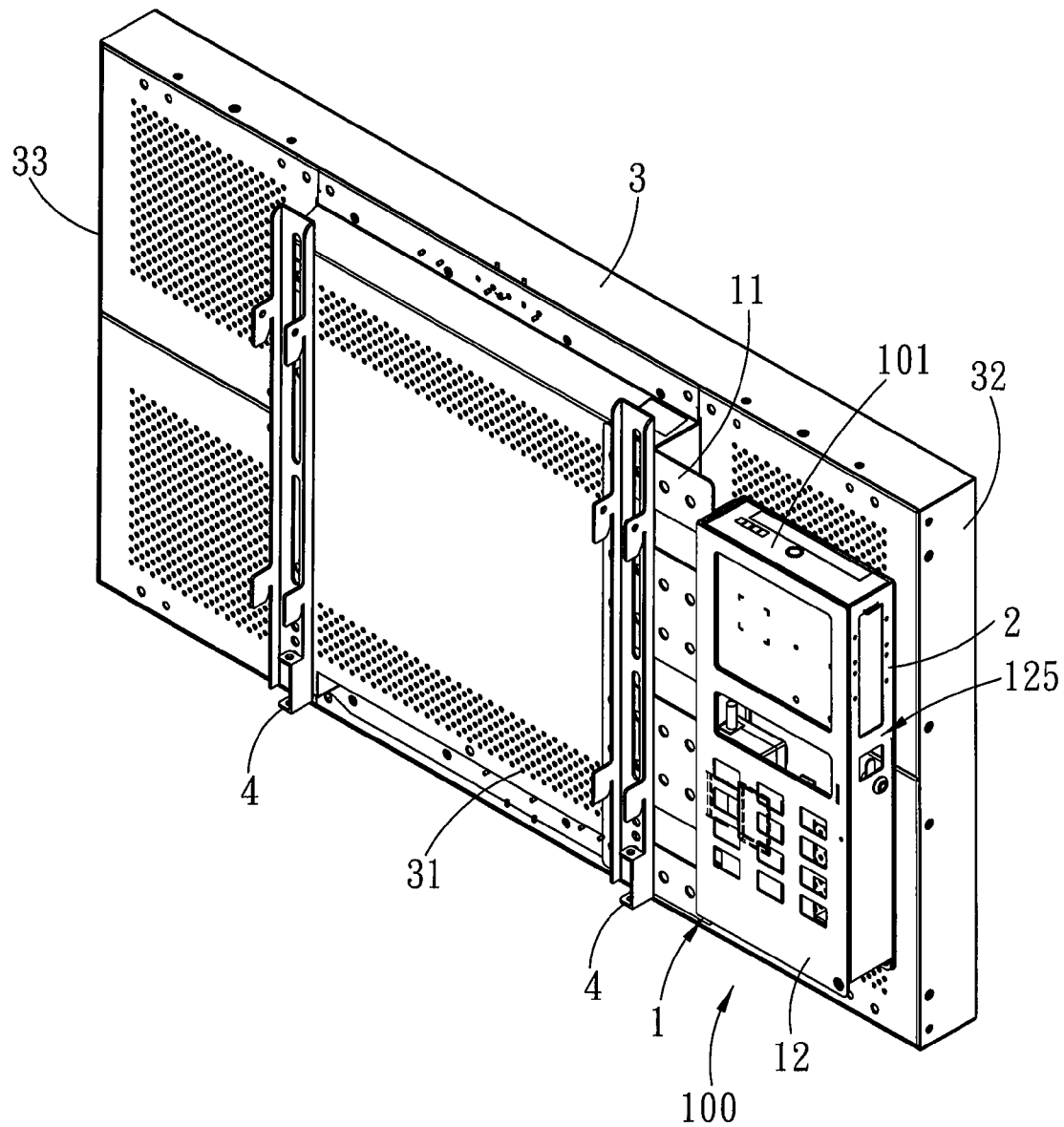
FIG. 1 is a perspective view of the preferred embodiment of a positioning rack module according to the present invention that is adapted to be disposed at a backside of a display device.
Figure 2:
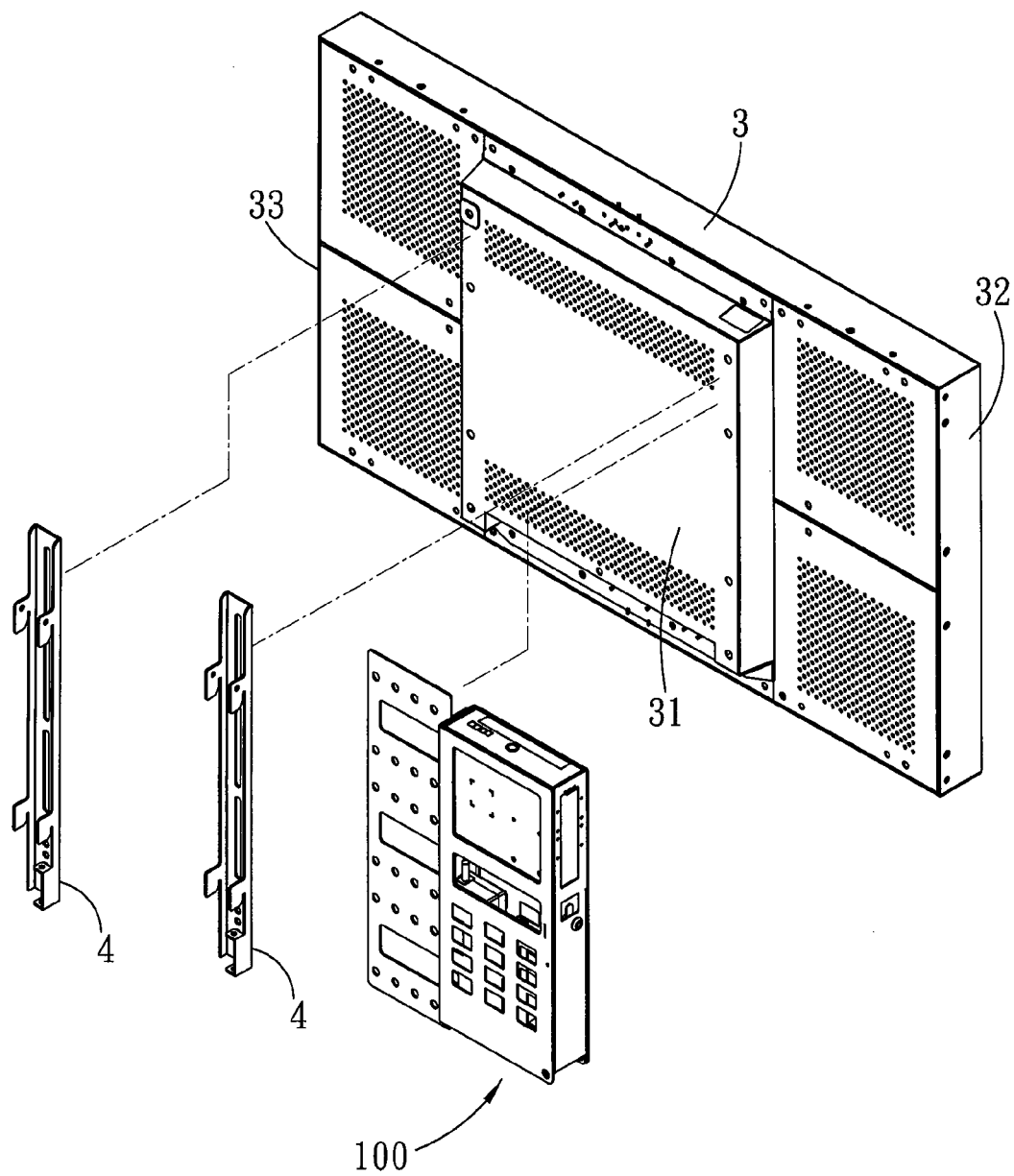
FIG. 2 is an exploded perspective view of the preferred embodiment, showing the relationships among the positioning rack module, the backside of the display device, and a wall mounting rack of the display device.

With reference to FIG. 1 and FIG. 2, the preferred embodiment of a positioning rack module 100 according to the present invention is for supporting a computer 101 at a backside 31 of a display device 3, such that while the display device 3 is mounted to a wall through a wall mounting rack 4 thereof, the positioning rack module 100 can be secured between the backside 31 and the wall mounting rack 4 of the display device 3, and can thereby support the computer 101 (which is a barebone in this embodiment) on the wall as well.

Figure 3:
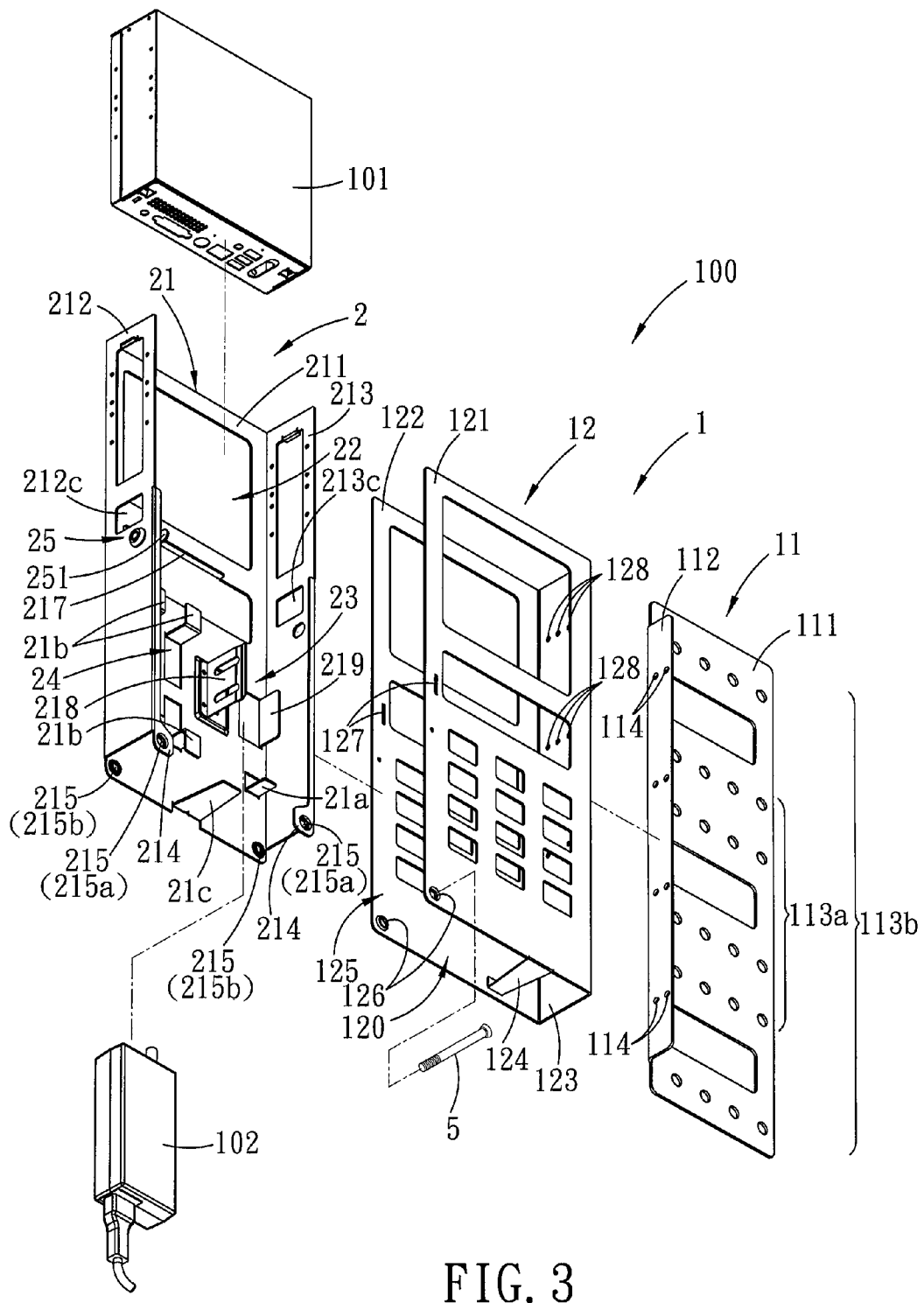
FIG. 3 is an exploded perspective view of the positioning rack module according to the preferred embodiment.
Figure 7:
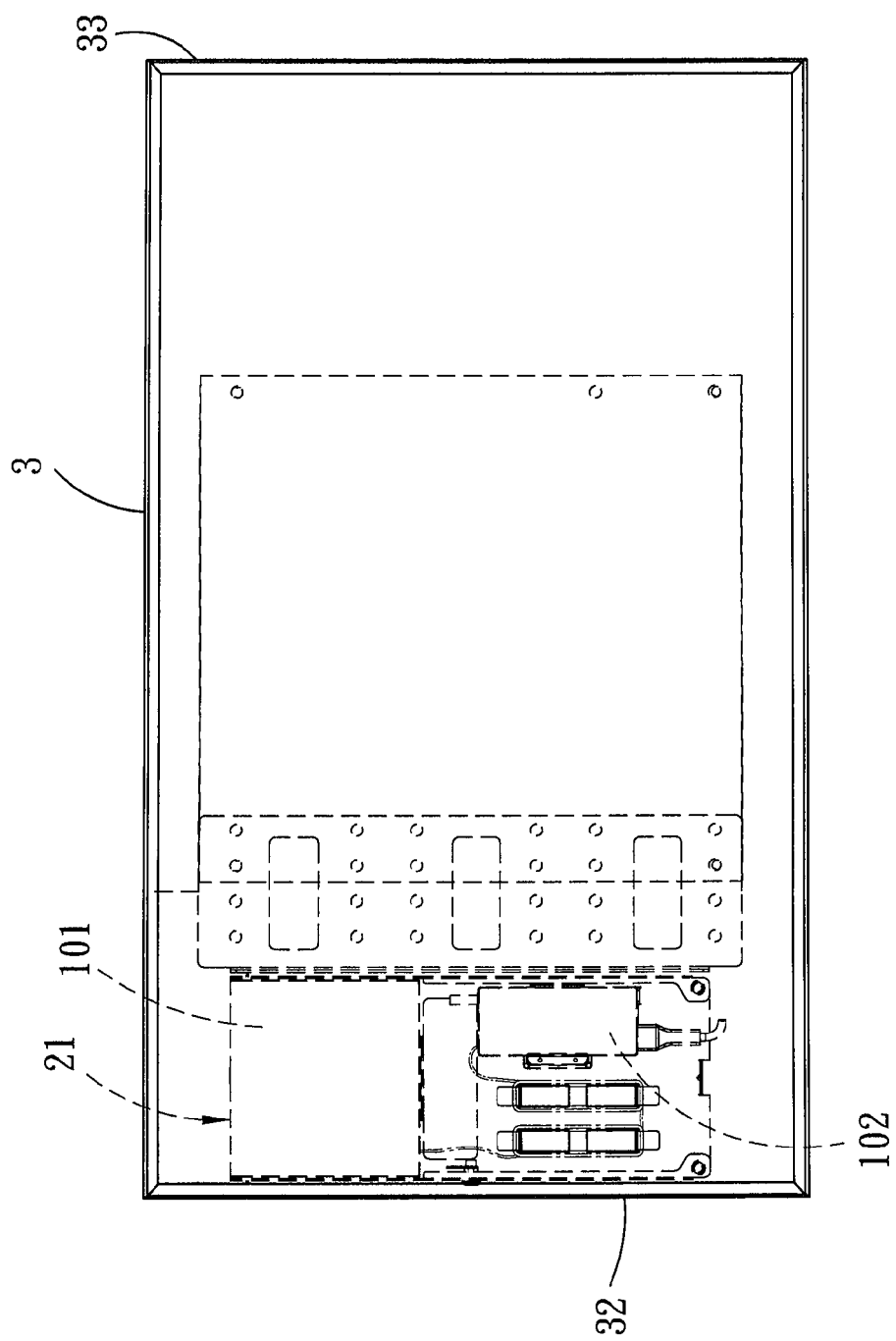
FIG. 7 is a front schematic view of the display device with the positioning rack module of the preferred embodiment mounted thereto, where the movable frame body is disposed at the hidden position.
Figure 8:
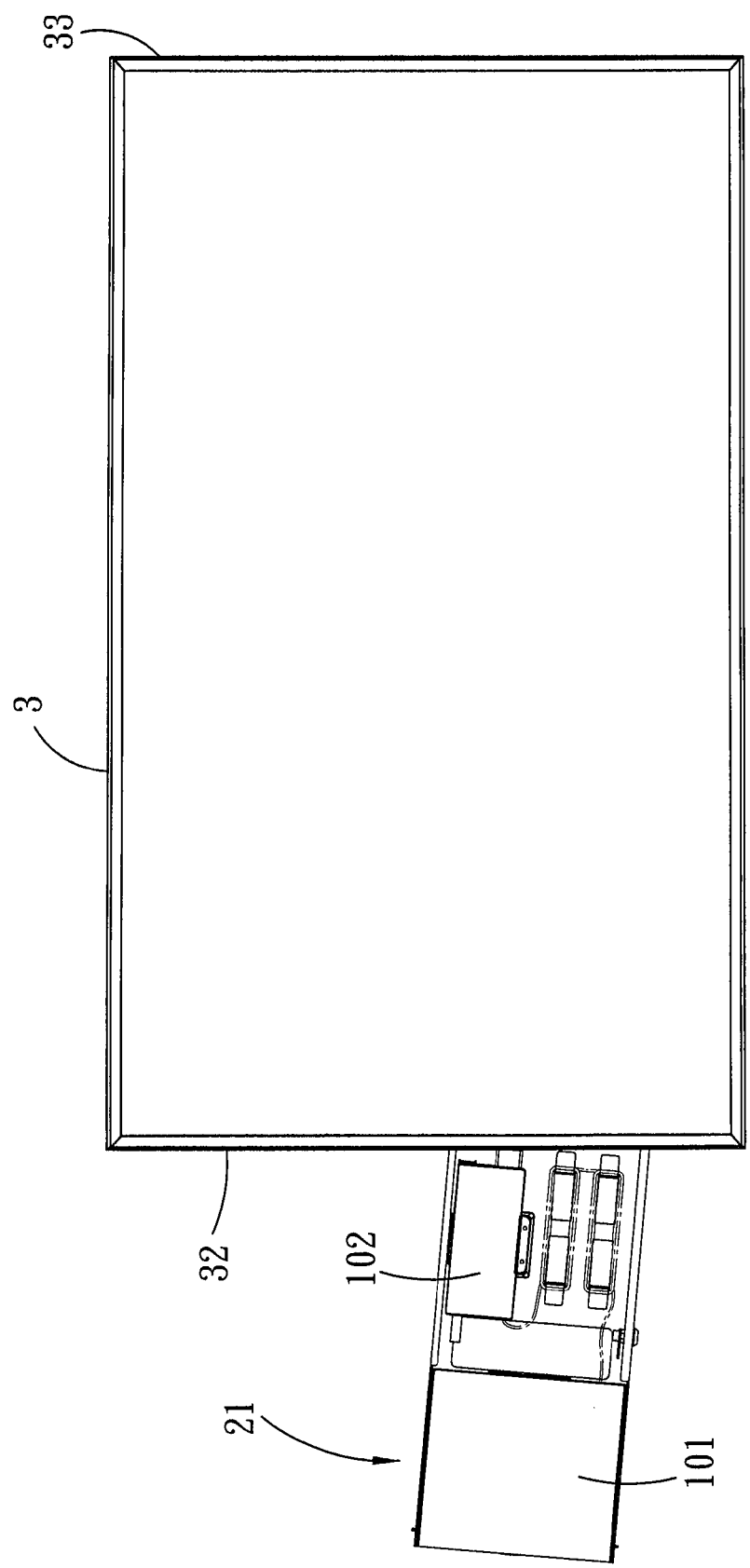
FIG. 8 is a front schematic view similar to FIG. 7, but illustrating the movable frame body disposed at the exposed position.

With reference to FIG. 1 and FIG. 3, the positioning rack module 100 includes a movable frame 2. The movable frame 2 includes a movable frame body 21 to be disposed at the backside 31 of the display device 3, and a first receiving portion 22 formed in the movable frame body 21 for receiving the computer 101. The movable frame body 21 is operable to move relative to the display device 3 between a hidden position (as shown in FIG. 7) and an exposed position (as shown in FIG. 8). The movable frame body 21 is hidden behind the backside 31 of the display device 3 when disposed at the hidden position. The movable frame body 21 extends beyond a lateral side of the display device 3 (specifically the left lateral side 32 of the display device 3 in this embodiment) when disposed at the exposed position.

As such, with the provision of the movable frame body 21, the computer 101 may be quickly and conveniently removed and installed when the display device 3 is mounted to a wall. Such kind of operations is no longer restricted by the narrow and limited space between the backside 31 of the display device 3 and the wall.

In this embodiment, the positioning rack module 100 further includes a fixing frame 1 to be mounted between the backside 31 of the display device 3 and the wall mounting rack 4. The fixing frame 1 is coupled to the movable frame body 21 so as to dispose the movable frame body 21 at the backside 31 of the display device 3. It should be noted herein that the structural design of the movable frame 2 maybe modified such that the movable frame 2 can be directly mounted between the backside 31 of the display device 3 and the wall mounting rack 4, while still being operable to move between the hidden position and the exposed position.

Figure 4:
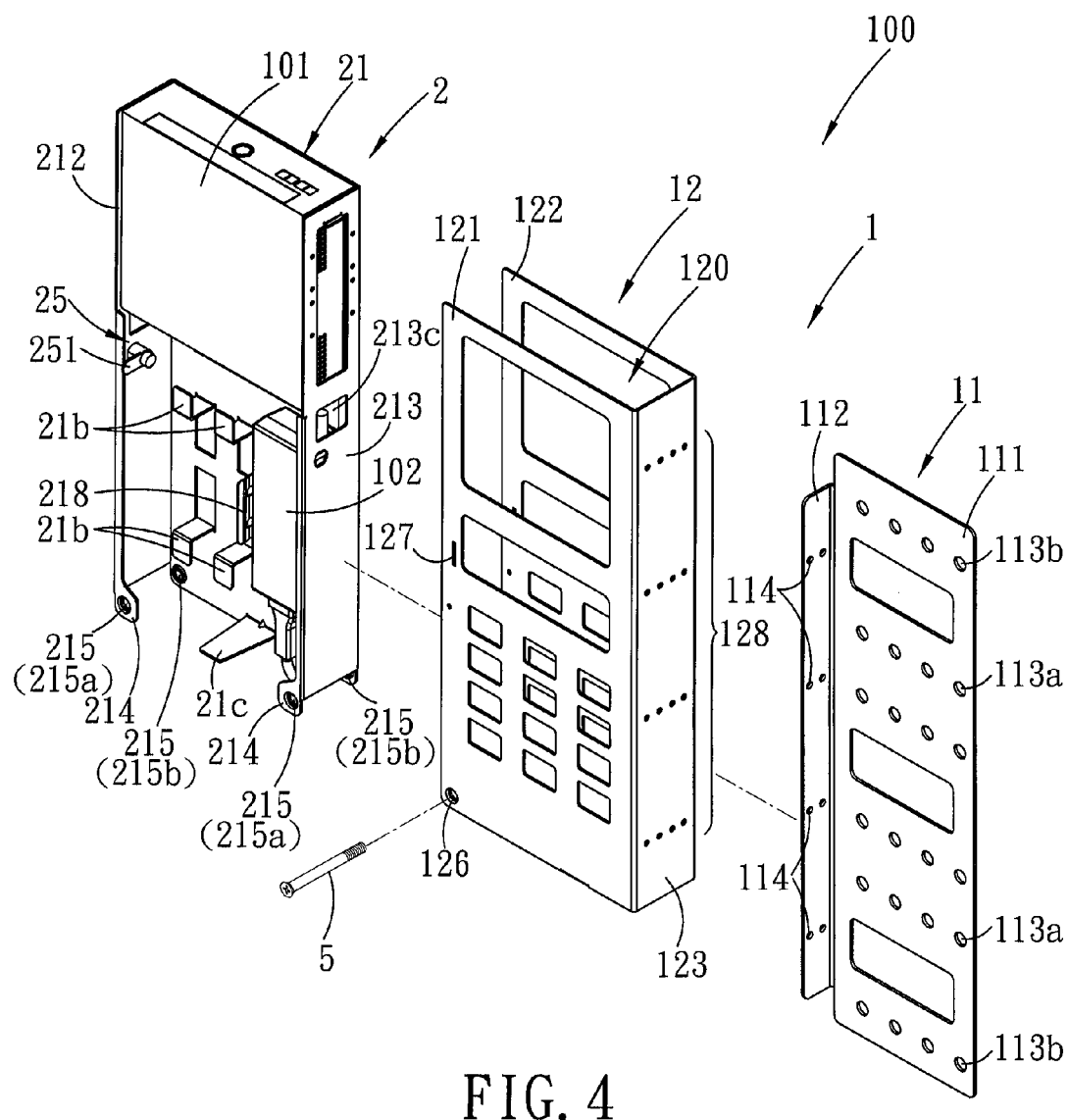
FIG. 4 is another exploded perspective view of the positioning rack module according to the preferred embodiment as viewed from another angle.

With reference to FIG. 3 and FIG. 4, preferably, the fixing frame 1 includes a first frame body 11, and a second frame body 12 coupled to the first frame body 11. The first frame body 11 is to be mounted between the backside 31 of the display device 3 and the wall mounting rack 4. The first frame body 11 has a first plate portion 111, and a second plate portion 112 that extends forwardly from the first plate portion 111. Opposite sides of the first plate portion 111 respectively face forward and rearward, while opposite sides of the second plate portion 112 respectively face left and right. The first plate portion 111 is for mounting between the backside 31 of the display device 3 and the wall mounting rack 4, and the second plate portion 112 is for coupling to the second frame body 12.

Figure 6:
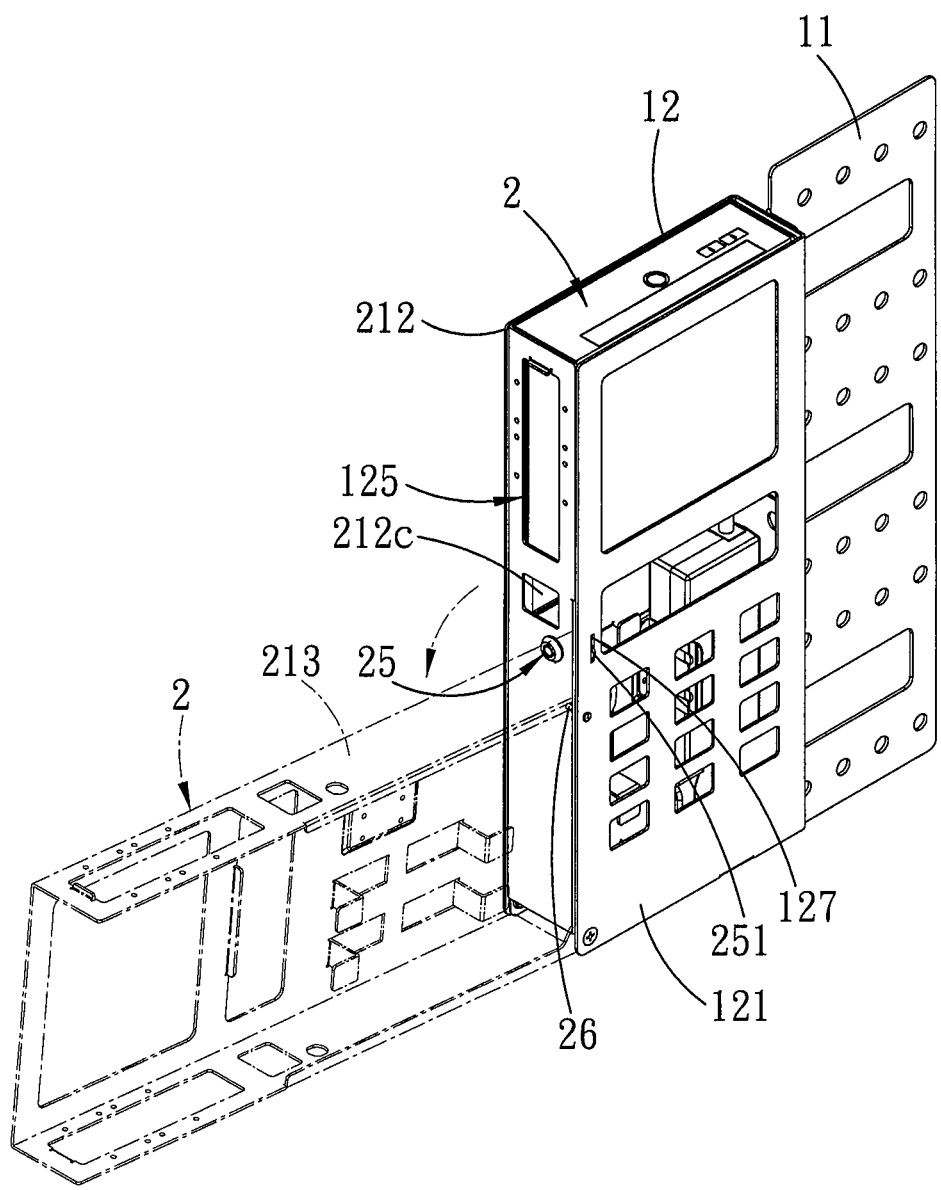
FIG. 6 is a perspective view of the positioning rack module according to the preferred embodiment when the movable frame body is disposed at an exposed position.

The second frame body 12 defines an inner space 120. The movable frame body 21 is coupled pivotally to the second frame body 12. In particular, the second frame body 12 includes a front plate 121, a rear plate 122 and a side plate 123 that cooperate to define the inner space 120. The first frame body 11 is mounted to the side plate 123 of the second frame body 12. The front and rear plates 121, 122 of the second frame body 12 cooperate to define an opening side 125 therebetween at a location opposite to the side plate 123 to permit movement of the movable frame body 21 into and out of the inner space 120. With further reference to FIG. 6, the movable frame body 21 is coupled pivotally to and is disposed between the front and rear plates 121, 122, such that the movable frame body 21 is disposed in the inner space 120 when at the hidden position, and is moved out of the inner space 120 via the opening side 125 when at the exposed position.

Consequently, the fixing frame 1 not only serves to dispose the movable frame body 21 of the movable frame 2 at the backside 31 of the display device 3, but also protects the computer 101 received in the movable frame body 21 and helps maintain an overall appearance of the positioning rack module 100.

Furthermore, the structural details of the first and second frame bodies 11, 12 of the preferred embodiment are as follows. The first plate portion 111 is formed with a plurality of device fastening holes 113a, 113b. In this embodiment, each of the device fastening holes labeled "113a" is a video electronics standards association (VESA) fastening hole of the 200×200 specification, and each of the device fastening holes labeled "113b" is a VESA fastening hole of the 400× 400 specification. The device fastening holes 113a, 113b correspond to fastening holes (not shown) in the backside 31 of the display device 3 to permit mounting of the first frame body 11 between the backside 3.1 of the display device 3 and the wall mounting rack 4. Since most modern flat-panel monitors and display devices implement the VESA Mounting Interface Standard (MIS), also known as the Flat Display Mounting Interface (FDMI), when the device fastening holes 113*a*, 113*b* are implemented in compliance with the VESA standard, the positioning rack module 100 of the present invention is less restricted in its application to modern flat panel monitors and display devices.

The second plate portion 112 of the first frame body 11 is formed with a plurality of first fastening holes 114, and the side plate 123 of the second frame body 12 is formed with a plurality of second fastening holes 128. The second fastening holes 128 are in groups of four, and the second fastening holes 128 in each group are disposed along the front-to-rear direction. Each group of the second fastening holes 128 in the side plate 123 of the second frame body 12 corresponds to a corresponding pair of the first fastening holes 114 in the second plate portion 112 of the first frame body 11 so as to permit mounting of the second plate portion 112 to the side plate 123. In addition, with the provision of the second fastening holes 128 that are in groups of four, and the first fastening holes 114 that are in groups of two, the position of the second plate portion 112 of the first frame body 11 relative to the side plate 123 of the second frame body 12 can be adjusted in the front-to-rear direction.

Figure 5:
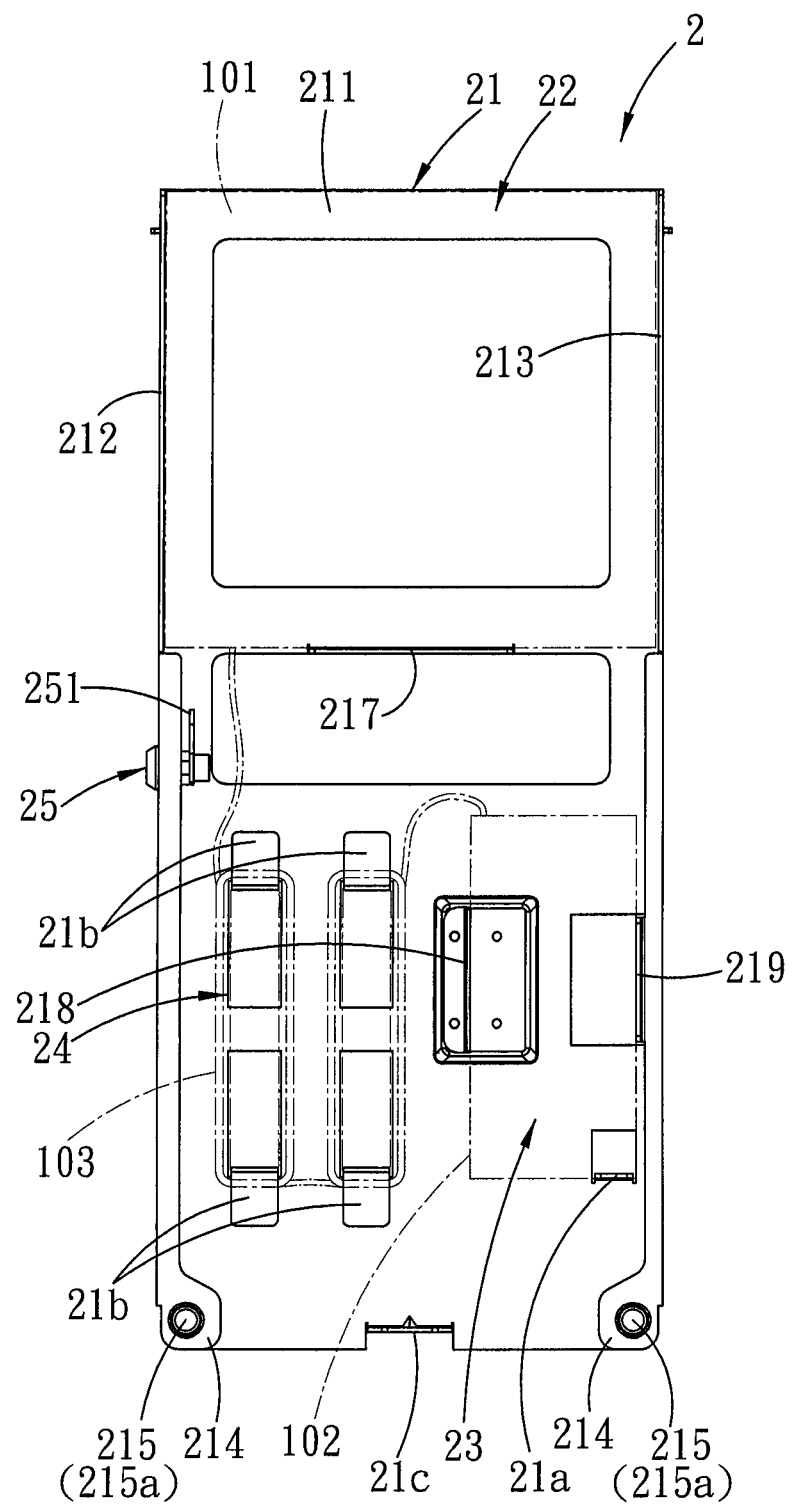
FIG. 5 is a front schematic view of the positioning rack module according to the preferred embodiment when a movable frame body is disposed at a hidden position.

With reference to FIGS. 3, 4 and 5, the movable frame body 21 includes a base plate 211, first and second side plates 212, 213 extending forwardly, vertically and respectively from opposite side edges of the base plate 211, and a first stop plate 217 extending transversely and forwardly from the base plate 211. The first receiving portion 22 is defined cooperatively by the first stop plate 217 and portions of the base plate 211 and the first and second side plates 212, 213 that are disposed above the first stop plate 217. In other words, the computer 101 is adapted to be received between the first and second side plates 212, 213 and above the first stop plate 217. Moreover, while the computer 101 can be secured at two sides to the first and second side plates 212, 213 via screw fasteners, the first stop plate 217 also provides support for holding up the computer 101.

Further, the movable frame 2 additionally includes a second receiving portion 23 and a cable-organizing portion 24 formed in the movable frame body 21 and disposed below the first receiving portion 22. In this embodiment, the movable frame body 21 further includes a movable partition plate 218, a fixed partition plate 219, a second stop plate 21*a*, and pairs of cable-organizing plates 21*b*. The movable partition plate 218 extends forwardly and vertically from the base plate 211, is disposed below the first stop plate 217, and is disposed closer to the second side plate 213 than the cable-organizing plates 21*b*. The fixed partition plate 219 extends forwardly and vertically from the base plate 211, is spaced apart from the movable partition plate 218, is disposed between the movable partition plate 218 and the second side plate 213, and is disposed below the first stop plate 217. The fixed partition plate 219 is disposed closer to the second side plate 213 than the movable partition plate 218. The second stop plate 21*a* extends transversely and forwardly from the base plate 211 below the first stop plate 217 and below the movable and fixed partition plates 218, 219 and within a transverse boundary defined between the movable and fixed partition plates 218, 219. The second receiving portion 23 is defined cooperatively by the movable and fixed partition plates 218, 219 and the second stop plate 21*a*. In this embodiment, the second receiving portion 23 is configured for receiving an electric component, e.g., a transformer 102, coupled electrically to the computer 101 such that the electric component is secured in position by the movable and fixed partition plates 218, 219 and the second stop plate 21*a*. It should be noted herein that in this embodiment, the movable partition plate 218 is fastened to the base plate 211 via screw fasteners. The base plate 211 is formed with multiple sets of fastening holes so as to permit coupling of the movable partition plate 218 at various distances relative to the fixed partition plate 219 in order to accommodate electronic components of various sizes.

The cable-organizing plates 21*b* extend forwardly from the base plate 211, and are disposed below the first stop plate 217. The cable-organizing plates 21*b* are provided in pairs, and the cable-organizing plates 21*b* in each pair are spaced apart from each other in a vertical direction. The cable-organizing plates 21*b* define cooperatively the cable-organizing portion 24, and are disposed closer to the first side plate 212 than the movable partition plate 218. In this embodiment, the cable-organizing plates 21*b* are L-shape hooks that permit wrapping of a cable 103 coupled electrically to the computer 101 therearound. In other words, the cable-organizing portion 24 is configured for receiving the cable 103. Overall speaking, in this embodiment, the cable-organizing portion 24 and the second receiving portion 23 are disposed respectively proximate to the first and second side plates 212, 213. However, the present invention is not limited in this aspect.

With the provision of the second receiving portion 23 and the cable-organizing portion 24, not only is it possible to store the electric component and the cable 103 along with the computer 101 in the movable frame 2, but the cable 103 can also be organized neatly in the movable frame 2 to thereby maintain a tidy overall appearance of the electronic device assembly incorporating the positioning rack module 100.

In this embodiment, in order to enhance the cable organization function of the positioning rack module 100, the second frame body 12 further includes a first extension plate 124 extending from a bottom edge of one of the front and rear plates 121, 122 toward the other one of the front and rear plates 121, 122. The movable frame body 21 further includes a second extension plate 21*c* extending forwardly from a bottom part of the base plate 211. When the movable frame body 21 is disposed at the hidden position, the first and second extension plates 124, 21*c* are spaced apart from each other in the vertical direction so as to permit extension of the cable 103 connected to the computer 101 therebetween. As such, the first and second extension plates 124, 21*c* also facilitate cable organization.

With reference to FIGS. 3, 4 and 6, in this embodiment, in order to couple the movable frame body 21 to the second frame body 12, each of the front and rear plates 121, 122 of the second frame body 12 is formed at the bottom edge with a first pivot hole 126 adjacent to the opening side 125. In addition, the movable frame body 21 further includes two protruding plates 214 that extend toward each other respectively from bottom edges of the first and second side plates 212, 213. The movable frame body 21 has four second pivot holes 215, respectively formed in the two protruding plates 214 and in two corners at the bottom edge of the base plate 211. In the drawings, the second pivot holes 215 formed in the protruding plates 215 are also denoted as "215*a*", and the second pivot holes 215 formed in the corners of the base plate 211 are also denoted as "215*b*". The second pivot hole 215*a* in each of the two protruding plates 214 is aligned with the second pivot hole 215*b* formed in a corresponding one of the corners of the base plate 211. As such, one pair of the corresponding second pivot holes 215*a*, 215*b* is disposed proximate to the first side plate 212, and the other pair of the corresponding second pivot holes 215a, 215b is disposed proximate to the second side plate 213. The fixing frame 1 further includes an axle 5 that extends through the first pivot holes 126 and a selected aligned pair of the second pivot holes 215a, 215b so as to couple pivotally the movable frame body 21 to the second frame body 12. In this embodiment, the movable frame 2 is disposed between the front and rear plates 121, 122 of the second frame body 12 with the second side plate 213 disposed proximate to the side plate 123 of the second frame body 12, and with the first side plate 212 disposed proximate to the opening side 125 of the second frame body 12. The first pivot holes 126 in the second frame body 12 are aligned with the pair of the second pivot holes 215a, 215b that are disposed proximate to the first side plate 212, and the axle 5 extends through the aligned pivot holes 126, 215a, 215b so as to couple pivotally the movable frame body 21 to the second frame body 12 such that the movable frame body 21 is operable to move between the hidden position and the exposed position.

In order to ensure the security of the computer 101 received in the positioning rack module 100, and to ensure that the movable frame 2 is not easily moved to the exposed position, in this embodiment, the movable frame 2 further includes a lock member 25. In particular, each of the front and rear plates 121, 122 of the second frame body 12 is formed with an engaging hole 127 at the opening side 125. The lock member 25 is disposed on a selected one of the first and second side plates 212, 213, and has a latch 251 that is operable to engage the engaging hole 127 in a corresponding one of the front and rear plates 121, 122. In this embodiment, the lock member 25 is disposed on the first side plate 212. The latch 251 of the lock member 25 is operable to extend through and engage the engaging hole 127 in the front plate 121 when the movable frame body 21 is disposed at the hidden position such that relative positions of the movable frame body 21 and the second frame body 12 are fixed.

With reference to FIG. 1 and FIG. 3, the positioning rack module 100 of the present invention utilizes the device fastening holes 113a, 113b formed in the first plate portion 111 of the first frame body 11 of the fixing frame 1 that correspond to the fastening holes (not shown) formed in the backside 31 of the display device 3 to permit mounting of the positioning rack module 100 between the backside 31 of the display device 3 and the wall mounting rack 4. In addition, the opening side 125 of the second frame body 12 is disposed proximate to the left lateral side 32 of the display device 3 in this embodiment.

With reference to FIGS. 1, 6, 7 and 8, when the positioning rack module 100 is disposed at the backside 31 of the display device 3, and when the movable frame body 21 of the movable frame 2 is disposed at the hidden position, the movable frame 2 is disposed between the front plate 121 and the rear plate 122 of the second frame body 12 of the fixing frame 1. At this time, the computer 101, the transformer 102 and the cable 103 received respectively in the first receiving portion 22, the second receiving portion 23 and the cable-organizing portion 24 of the movable frame 2 are all disposed between the front plate 121 and the rear plate 122 of the second frame body 12 of the fixing frame 1. On the other hand, when the user wishes to operate on the computer 101 (e.g., perform maintenance tasks), the latch 251 of the lock member 25 can be operated to disengage the engaging hole 127 formed in the corresponding one of the front and rear plates 121, 122 of the second frame body 12 so as to permit moving of the movable frame body 21 out of the fixing frame 1 via the opening side 125 of the fixing frame 1 from the hidden position to the exposed position in order to be exposed from the corresponding lateral side 32, 33 of the display device 3 to thereby allow the computer 101, the transformer 102 and the cable 103 to be exposed for removal or the like.

With reference to FIGS. 3, 4 and 7, it should be noted herein that the movable frame body 21 has four second pivot holes 215, two of which (215a) are formed respectively in the two protruding plates 214 respectively extending from bottom edges of the first and second side plates 212, 213, and the other two of which (215b) are formed respectively in the two corners at the bottom edge of the base plate 211 respectively proximate to the first and second side plates 212, 213. In other words, there are two pairs of the second pivot holes 215a, 215b, respectively corresponding to the first and second side plates 212, 213. These second pivot holes 215a, 215b are provided to serve the function of enabling the movable frame body 21 to be coupled to the second frame body 12 of the fixing frame 1 at two different orientations such that, whether the fixing frame 1 is mounted to the right or the left lateral side 32, 33 of the display device 3 depending on the application requirements (e.g., the surrounding environment of the display device 3), the movable frame body 21 can be accessed by the user when moved to the exposed position in an orientation that facilitates easy and convenient access to the first receiving portion 22, the second receiving portion 23 and the cable-organizing portion 24 so as to permit user operation on the computer 101, the transformer 102 and the cable 103 when needed. For instance, in this embodiment, the positioning rack module 100 is disposed at the left-hand portion of the backside 31 of the display device 3 (as shown in FIG. 7), such that the opening side 125 of the second frame body 12 of the fixing frame 1 opens toward the left lateral side 32 of the display device 3. As such, the movable frame body 21 is coupled to the second frame 12 via the pair of the second pivot holes 215a, 215b that correspond to the first side plate 212. On the other hand, when the positioning rack module 100 needs to be disposed at the right-hand portion of the backside 31 of the display device 3 (as shown in FIG. 7), the opening side 125 of the second frame body 12 of the fixing frame 1 needs to open toward the right lateral side 33 of the display device 3. As such, the movable frame body 21 is coupled to the second frame 12 via the pair of the second pivot holes 215a, 215b that correspond to the second side plate 213. In other words, regardless of which portion of the backside 31 of the display device 3 the fixing frame 1 is disposed, the movable frame body 21 needs to be oriented such that opening sides of the first and second receiving portions 22, 23 and the cable-organizing portion 24 face forwardly with respect to the display device 3. While the second frame body 12 only has one opening side 125 and one pair of the first pivot holes 126, with the provision of two pairs of the second pivot holes 215a, 215b, the above can be achieved with ease by extending the axle 5 through the first pivot holes 126 and the pair of the second pivot holes 215a, 215b that correspond to the one of the first and second side plates 212, 213 to be disposed proximate to the opening side 125 of the second frame body 12. Moreover, the lock member 25 can be disposed on either one of the first and second side plates 212, 213, and the front and rear plates 121, 122 of the second frame body 12 are each formed with the engaging hole 127 to further facilitate the above-mentioned requirement for the fixing frame 1 to be mountable on different parts of the backside 31 of the display device 3, thereby enhancing the flexibility of the positioning rack module 100 of the present invention.

Additionally, the first and second side plates 212, 213 of the movable frame 21 are respectively formed with openings 212c, 213c to permit extension of the user's finger(s) in trying to move the movable frame 21 from the hidden position to the exposed position. Moreover, the fixing frame 1 may further include a stop pin 26 (as shown in FIG. 6) disposed proximate to the opening side 125 on a selected one of the front and rear plates 121, 122 of the second frame body 12 so as to restrict the extent of the extension of the movable frame body 21 beyond the lateral side 32, 33 of the display device 3 when disposed at the exposed position. For instance, in this embodiment, the stop pin 26 stops the movable frame body 21 by abutting against the second side plate 213.

The present invention al so provides for an electronic device assembly including the display device 3 and the positioning rack module 100 as described above.

In summary, with the structural features of the positioning rack module 100, the present invention facilitates easy, convenient and quick installation and removal of a computer 101 to and from the backside 31 of the display device 3 such that this kind of operations on the computer 101 is not restricted by the limited space available between the backside 31 of the display device 3 and a wall to which the display device 3 is hung. In addition, through the cooperating structures of the fixing frame 1 and the movable frame 2, a certain degree of freedom is provided to the positioning rack module 100 of the present invention in terms of mounting position thereof relative to the backside 31 of the display device 3, while ensuring that the overall appearance of the positioning rack module 100 is neatly maintained.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A positioning rack module for supporting a computer a backside of a display device, said positing rack module comprising;
    a movable frame includin a movable frame body to be disposed at the backside of the display device, and a first receiving portion formed in said movable frame body for receiving the computer, said movable frame body being operable to move relative to the display device between a hidden position and an exposed position, said movable frame body being hidden behind the backside of the display device when disposed at said hidden position, said movable frame body extending beyond a lateral side of the display device when disposed at said exposed position;
    the display device including a wall mounting rack for mounting the display device to a wall, wherein said positing rack module further comprises a fixing frame to be mounted between the backside of the display device and the wall mounting rack, said fixing frame being coupled to said movable frame body so as to dispose said movable frame body at the backside of the display device;
    wherein said fixing frame includes a first frame body, and a second frame body coupled to said first frame body,
        said first frame body being mounted between said backside of said display device and said wall mounting rack,
        said second frame body defining an inner space, said movable frame body being coupled pivotally to said second frame body, and being disposed in said inner space when disposed at said hidden position, and being moved out of said inner space when disposed at said exposed position.

2. The positioning rack module as claimed in claim 1, wherein said second frame body includes a front plate, a rear plate and a side plate that cooperate to define said inner space, said first frame body being mounted to said side plate of said second frame body, said movable frame body being coupled pivotally to and being disposed between said front and rear plates.

3. The positioning rack module as claimed in claim 2, wherein said first frame body has a first plate portion, and a second plate portion that extends forwardly from said first plate portion,
    said first plate portion being formed with a plurality of device fastening holes to permit mounting of said first frame body between the backside of the display device and the wall mounting rack,
    said second plate portion of said first frame body being formed with a plurality of first fastening holes and said side plate of said second frame body being formed with a plurality of second fastening holes so as to permit mounting of said second plate portion to said side plate of said second frame body.

4. The positioning rack module as claimed in claim 2, wherein said movable frame body includes a base plate, first and second side plates extending forwardly, vertically and respectively from opposite side edges of said base plate, and a first stop plate extending transversely and forwardly from said base plate,
    said first receiving portion being defined cooperatively by said first stop plate and portions of said base plate and said first and second side plates that are disposed above said first stop plate.

5. The positioning rack module as claimed in claim 4, wherein said movable frame further includes a second receiving portion and a cable-organizing portion formed in said movable frame body and disposed below said first receiving portion, said second receiving portion being configured for receiving an electric component coupled electrically to the computer, said cable-organizing portion being configured for receiving a cable coupled electrically to the computer.

6. The positioning rack module as claimed in claim 5, wherein said movable frame body further includes a movable partition plate, a fixed partition plate, and a second stop plate,
    said movable partition plate and said fixed partition plate extending forwardly and vertically from said base plate, being disposed below said first stop plate, and being spaced apart from each other,
    said fixed partition plate being disposed closer to said second side plate than said movable partition plate,
    said second stop plate extending transversely and forwardly from said base plate below said first stop plate and below said movable and fixed partition plates and within a transverse boundary defined between said movable and fixed partition plates,
    said second receiving portion being defined cooperatively by said movable and fixed partition plates and said second stop plate.

7. The positioning rack module as claimed in claim 6, wherein said movable frame body further includes a pair of cable-organizing plates, said cable-organizing plates extending forwardly from said base plate, being disposed below said first stop plate, being spaced apart from each other in a vertical direction, and defining cooperatively said cable-organizing portion, said cable-organizing portion and said second receiving portion being disposed respectively proximate to said first and second side plates.

8. The positioning rack module as claimed in claim 7, wherein said second frame body further includes a first extension plate extending from a bottom edge of one of said front and rear plates toward the other one of said front and rear plates, said movable frame body further including a second extension plate extending forwardly from a bottom part of said base plate, said first and second extension plates being spaced apart from each other in the vertical direction when said movable frame body is disposed at said hidden position so as to permit extension of a cable connected to the computer therebetween.

9. The positioning rack module as claimed in claim 8, wherein said front and rear plates of said second frame body cooperate to define an opening side therebetween at a location opposite to said side plate to permit movement of said movable frame body into and out of said inner space, each of said front and rear plates of said second frame body being formed at said bottom edge with a first pivot hole adjacent to said opening side, said movable frame body further including two protruding plates that extend toward each other respectively from bottom edges of said first and second side plates, said movable frame body having four second pivot holes, respectively formed in said two protruding plates and in two corners at said bottom edge of said base plate, said second pivot hole in each of said two protruding plates being aligned with said second pivot hole formed in a corresponding one of said corners, said fixing frame further including an axle that extends through said first pivot holes and a selected aligned pair of said second pivot holes so as to couple pivotally said movable frame body to said second frame body.

10. The positioning rack module as claimed in claim 9, wherein each of said front and rear plates of said second frame body is formed with an engaging hole at said opening side, and said movable frame further includes a lock member disposed on a selected one of said first and second side plates, said lock member having a latch that is operable to engage said engaging hole in a corresponding one of said front and rear plates.

11. An electronic device assembly, comprising:
a display device having a backside; and
a positioning rack module for supporting a computer at said backside of said display device, said positioning rack module including:
a movable frame that includes a movable frame body disposed at said backside of said display device, and
a first receiving portion formed in said movable frame body for receiving the computer, said movable frame body being operable to move relative o said display device between a hidden position and an exposed position, said movable frame body being hidden behind said backside of said display device when disposed at said hidden position, said movable frame body extending beyond a lateral side of said display when disposed at said exposed position:
wherein said display device includes a watt mounting rack for mounting said display device to a wall, said positioning rack module further including a fixing frame mounted between said backside of said display device and said wall mounting rack, said fixing frame being coupled to said movable frame body so as to dispose said movable frame body at said backside of said display device, and
wherein said fixing frame includes a first frame body, and a second frame body coupled to said first frame body, said first frame body being mounted between said backside of said display device and said wall mounting rack, said second frame body defining an inner space, said movable frame body being coupled pivotally to said second frame body, and being disposed in said inner space when disposed at said hidden position, and being moved out of said inner space when disposed at said exposed position.

12. The electronic device assembly as claimed in claim 11, wherein said second frame body includes a front plate, a rear plate and a side plate that cooperate to define said inner space, said first frame body being mounted to said side plate of said second frame body, said movable frame body being coupled pivotally to and being disposed between said front and rear plates.

13. The electronic device assembly as claimed in claim 12, wherein said first frame body has a first plate portion, and a second plate portion that extends forwardly from said first plate portion, said first plate portion being formed with a plurality of device fastening holes to permit mounting of said first frame body between said backside of said display device and said wall mounting rack, said second plate portion being formed with a plurality of first fastening holes and said side plate of said second frame body being formed with a plurality of second fastening holes so as to permit mounting of said second plate portion to said side plate of said second frame body.

14. The electronic device assembly as claimed in claim 12, wherein said movable frame body includes a base plate, first and second side plates extending forwardly, vertically and respectively from opposite side edges of said base plate, and a first stop plate extending transversely and forwardly from said base plate, said first receiving portion being defined cooperatively by said first stop plate and portions of said base plate and said first and second side plates that are disposed above said first stop plate.

15. The electronic device assembly as claimed in claim 14, wherein said movable frame further includes a second receiving portion and a cable-organizing portion formed in said movable frame body and disposed below said first receiving portion, said second receiving portion being configured for receiving an electric component coupled electrically to the computer, said cable-organizing portion being configured for receiving a cable coupled electrically to the computer.

16. The electronic device assembly as claimed in claim 15, wherein said movable frame body further includes a movable partition plate, a fixed partition plate, and a second stop plate, said movable partition plate and said fixed partition plate extending forwardly and vertically from said base plate, being disposed below said first stop plate, and being spaced apart from each other, said fixed partition plate being disposed closer to said second side plate than said movable partition plate, said second stop plate extending transversely and forwardly from said base plate below said first stop plate and below said movable and fixed partition plates and within a transverse boundary defined between said movable and fixed partition plates, said second receiving portion being defined cooperatively by said movable and fixed partition plates and said second stop plate.

17. The electronic device assembly as claimed in claim 16, wherein said movable frame body further includes a pair of cable-organizing plates, said cable-organizing plates extending forwardly from said base plate, being disposed below said first stop plate, being spaced apart from each other in a vertical direction, and defining cooperatively said cable-organizing portion, said cable-organizing portion and said second receiving portion being disposed respectively proximate to said first and second side plates.

18. The electronic device assembly as claimed in claim 17, wherein said second frame body further includes a first extension plate extending from a bottom edge of one of said front and rear plates toward the other one of said front and rear plates,
said movable frame body further including a second extension plate extending forwardly from a bottom part of said base plate,
said first and second extension plates being spaced apart from each other in the vertical direction when said movable frame body is disposed at said hidden position so as to permit extension of a cable connected to the computer therebetween.

19. The electronic device assembly as claimed in claim 18, wherein said front and rear plates of said second frame body cooperate to define an opening side therebetween at a location opposite to said side plate to permit movement of said movable frame body into and out of said inner space,
each of said front and rear plates of said second frame body being formed at said bottom edge with a first pivot hole adjacent to said opening side, said movable frame body further including two protruding plates that extend toward each other respectively from bottom edges of said first and second side plates,
said movable frame body having four second pivot holes, respectively formed in said two protruding plates and in two corners at said bottom edge of said base plate, said second pivot hole in each of said two protruding plates being aligned with said second pivot hole formed in a corresponding one of said corners,
said fixing frame further including an axle that extends through said first pivot holes and a selected aligned pair of said second pivot holes so as to couple pivotally said movable frame body to said second frame body.

20. The electronic device assembly as claimed in claim 19, wherein each of said front and rear plates of said second frame body is formed with an engaging hole at said opening side, and said movable frame further includes a lock member disposed on a selected one of said first and second side plates, said lock member having a latch that is operable to engage said engaging hole in a corresponding one of said front and rear plates.

* * * * *